(12) United States Patent
Asaka

(10) Patent No.: US 11,631,933 B2
(45) Date of Patent: Apr. 18, 2023

(54) ANTENNA MODULE AND COMMUNICATION DEVICE

(71) Applicant: Murata Manufacturing Co., Ltd., Kyoto (JP)

(72) Inventor: Atsushi Asaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 315 days.

(21) Appl. No.: 16/571,658

(22) Filed: Sep. 16, 2019

(65) Prior Publication Data

US 2020/0014113 A1 Jan. 9, 2020

Related U.S. Application Data

(63) Continuation of application No. PCT/JP2018/008748, filed on Mar. 7, 2018.

(30) Foreign Application Priority Data

Mar. 21, 2017 (JP) .............................. JP2017-054214

(51) Int. Cl.
*H01Q 1/22* (2006.01)
*H01Q 21/06* (2006.01)
(Continued)

(52) U.S. Cl.
CPC ............ *H01Q 1/2283* (2013.01); *H01L 23/66* (2013.01); *H01Q 9/0407* (2013.01); *H01Q 21/065* (2013.01); *H01L 2223/6677* (2013.01)

(58) Field of Classification Search
CPC ........ H01Q 1/2283; H01Q 1/52; H01Q 1/521; H01Q 1/523; H01Q 1/525; H01Q 1/526;
(Continued)

(56) References Cited

U.S. PATENT DOCUMENTS 6,218,610 B1  4/2001  Suzuki
2009/0256752 A1  10/2009  Akkermans et al.
(Continued)

FOREIGN PATENT DOCUMENTS

CN  103493292 A  1/2014
CN  105720352 A  6/2016
(Continued)

OTHER PUBLICATIONS

International Search Report Issued in Patent Application No. PCT/JP2018/008748 dated Apr. 24, 2018.
(Continued)

*Primary Examiner* — Robert Karacsony
(74) *Attorney, Agent, or Firm* — Pearne & Gordon LLP

(57) ABSTRACT

An antenna module (1) according to the present disclosure has a dielectric substrate (20), an array antenna (10) including a plurality of patch antennas (111), an RFIC (40) electrically connected to the plurality of patch antennas (111), a signal conductor post (131) electrically connected to the RFIC (40), and a ground conductor post (132) set at a ground potential. The ground conductor post (132) is arranged, when viewed from a direction perpendicular to a first main surface of the dielectric substrate (20), between the signal conductor post (131) and a first side surface closest to the signal conductor post (131) of the dielectric substrate (20) in a polarizing direction of radio frequency signals to be emitted or received by the plurality of patch antennas (111).

20 Claims, 9 Drawing Sheets

(51) Int. Cl.
*H01Q 9/04* (2006.01)
*H01L 23/66* (2006.01)

(58) Field of Classification Search
CPC .... H01Q 1/528; H01Q 9/0407; H01Q 9/0414; H01Q 9/0457; H01Q 21/06; H01Q 21/065; H01Q 23/00; H01L 23/66; H01L 2223/6677
See application file for complete search history.

(56) References Cited

U.S. PATENT DOCUMENTS

| | | | | |
|---|---|---|---|---|
| 2010/0164783 | A1* | 7/2010 | Choudhury | H01Q 21/065 342/175 |
| 2015/0070228 | A1* | 3/2015 | Gu | H01Q 1/2283 343/727 |
| 2016/0049723 | A1 | 2/2016 | Baks et al. | |
| 2016/0178730 | A1 | 6/2016 | Trotta et al. | |
| 2017/0236776 | A1* | 8/2017 | Huynh | H01Q 21/061 257/428 |

FOREIGN PATENT DOCUMENTS

| | | |
|---|---|---|
| JP | H11-17377 A | 1/1999 |
| JP | 2011-519517 A | 7/2011 |
| WO | 2012125774 A2 | 9/2012 |
| WO | 2016-063759 A1 | 4/2016 |

OTHER PUBLICATIONS

Written Opinion Issued in Patent Application No. PCT/JP2018/008748 dated Apr. 24, 2018.

* cited by examiner

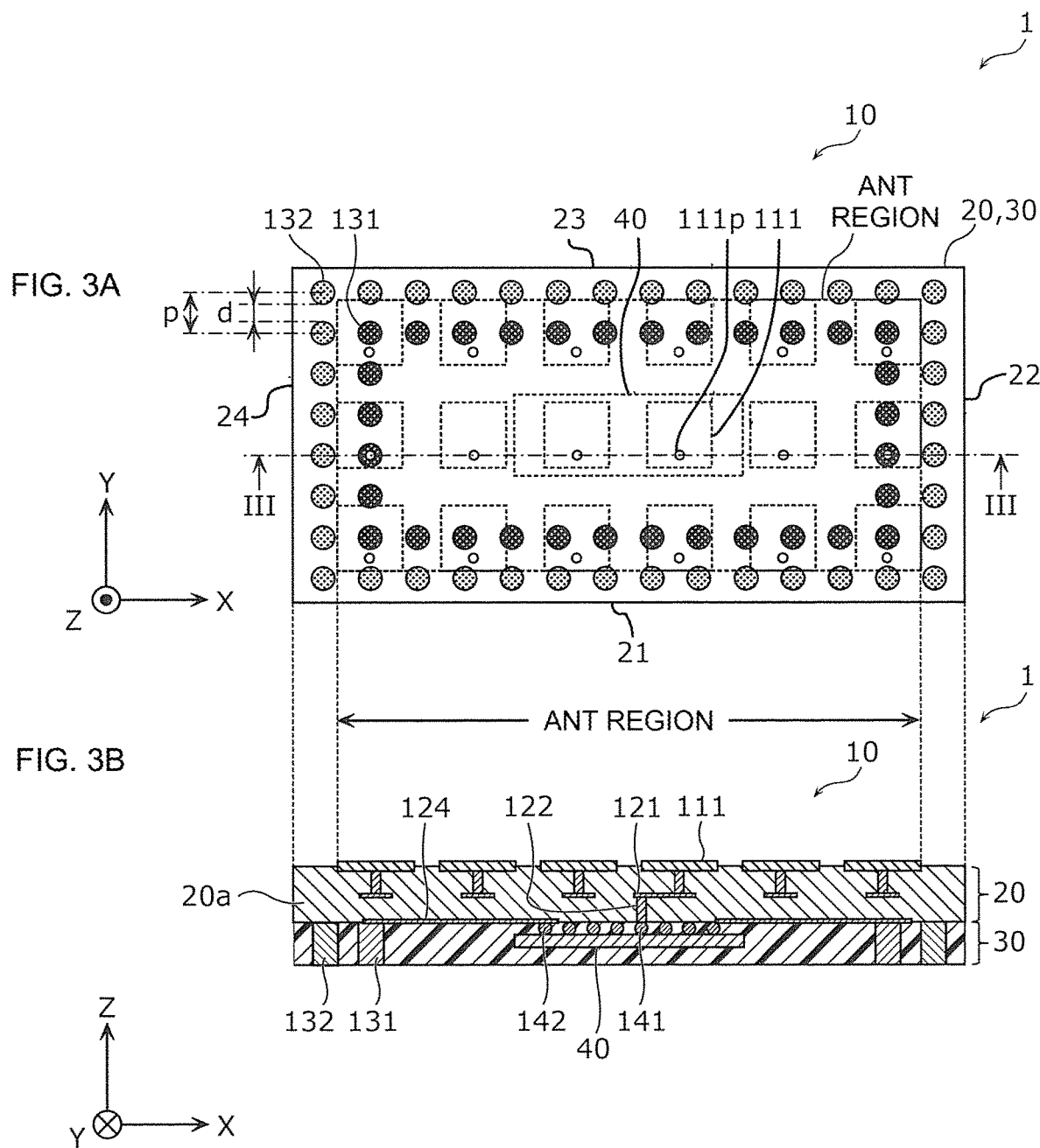

ANTENNA MODULE AND COMMUNICATION DEVICE

This is a continuation of International Application No. PCT/JP2018/008748 filed on Mar. 7, 2018 which claims priority from Japanese Patent Application No. 2017-054214 filed on Mar. 21, 2017. The contents of these applications are incorporated herein by reference in their entireties.

BACKGROUND OF THE DISCLOSURE

Field of the Disclosure

The present disclosure relates to an antenna module and a communication device.

Description of the Related Art

As an antenna module having patch antennas for wireless communication and a radio frequency circuit component integrated together, a structure is suggested in which patch antennas are arranged on a first main surface side of a dielectric substrate and a radio frequency element (that is, a radio frequency circuit component) is mounted on a second main surface opposite to the first main surface of the dielectric substrate (for example, refer to Patent Document 1). And, with a ground layer (that is a ground pattern conductor) provided in the dielectric substrate and ground conductor posts provided on the second main surface of the dielectric substrate, unwanted emission from the radio frequency element can be shielded. The second main surface of the dielectric substrate also has signal conductor posts further provided thereto.

Patent Document 1: International Publication No. 2016/063759

BRIEF SUMMARY OF THE DISCLOSURE

However, in the above-described conventional structure, the RF characteristics may become deteriorated due to the influence of a radio frequency signal emitted from any of the patch antennas into space or a radio frequency signal in space received by any of the patch antennas. Specifically, with these radio frequency signals in space propagating to signal terminals (signal conductor posts in the above-described conventional structure), the radio frequency signals propagating to the signal terminals are inputted to the radio frequency circuit component to cause deterioration in the above-described RF characteristics. This problem is particularly significant in, for example, millimeter waves, in which the radio frequency signals tend to propagate to the signal terminals.

The present disclosure was made to solve the above-described problem, and has an object of intending to improve RF characteristics for an antenna module and communication device having patch antennas and a radio frequency circuit component integrated together.

To achieve the above-described object, an antenna module according to one aspect of the present disclosure has a dielectric substrate, an antenna including a plurality of patch antennas provided to a first main surface side of the dielectric substrate to emit or receive radio frequency signals, a radio frequency circuit component mounted to a second main surface side opposite to the first main surface of the dielectric substrate and electrically connected to the plurality of patch antennas, a signal terminal provided to the second main surface side of the dielectric substrate and electrically connected to the radio frequency circuit component, and a ground terminal provided to the second main surface side of the dielectric substrate and set at a ground potential. The ground terminal is arranged, when viewed from a direction perpendicular to the first main surface of the dielectric substrate, between the signal terminal and a first side surface of the dielectric substrate closest to the signal terminal in a polarizing direction of the radio frequency signals to be emitted or received by the plurality of patch antennas.

This allows isolation of the plurality of patch antennas and the signal terminal to be improved, with the ground terminal serving as a shield. As a result, an influence to be given by the above-described radio frequency signal on the signal terminal can be reduced. Therefore, deterioration in RF characteristics caused by inputting, to the radio frequency circuit component, the radio frequency signals propagating from the plurality of patch antennas to the signal terminal can be reduced. That is, an improvement in RF characteristics is intended for the antenna module having the patch antennas and the radio frequency circuit component integrated together.

Also, the radio frequency circuit component may be arranged, when viewed from the perpendicular direction, in a region where the plurality of patch antennas are arranged.

This allows feeder lines connecting the radio frequency circuit component and the respective patch antennas to be designed to be short. Thus, with the reduction of the losses produced by the feeder lines, a high-performance antenna module can be achieved. This antenna module is suitable as an antenna module of millimeter wave bands, in which the losses produced by the feeder lines tend to increase as those feeder lines are longer.

Also, the antenna module may have a plurality of ground terminals including the ground terminal, and the plurality of ground terminals may be arranged as being aligned, when viewed from the perpendicular direction, at positions along the first side surface in an end portion of the dielectric substrate.

This allows isolation of the plurality of patch antennas and the signal terminal to be further improved, and thus a further improvement in RF characteristics can be intended.

Also, the antenna module may have a plurality of ground terminals including the ground terminal, and the plurality of ground terminals may be arranged as being aligned, when viewed from the perpendicular direction, so as to surround the signal terminal.

This allows isolation of the plurality of patch antennas and the signal terminal to be further improved, and thus a further improvement in RF characteristics can be intended.

Also, the signal terminal may be a terminal to which a signal corresponding to the radio frequency signal is inputted or outputted, and the plurality of ground terminals may be arranged as being aligned, when viewed from the perpendicular direction, so as to surround all signal terminals including the signal terminal.

This allows isolation of the plurality of patch antennas and all signal terminals to be further improved, and thus a further improvement in RF characteristics can be intended.

Also, the plurality of ground terminals may be arranged as being aligned, when viewed from the perpendicular direction, at positions along all side surfaces in an end portion of the dielectric substrate.

This allows isolation of the plurality of patch antennas and the signal terminal to be improved and also allows the signal terminal to be arranged at any position in a region surrounded by the plurality of ground terminals. That is, flexibility in signal terminal layout is improved.

Also, the plurality of ground terminals may be arranged as being equidistantly aligned, and a distance between centers of two ground terminals adjacent to each other among the plurality of ground terminals may be ½ or shorter of an effective wave length of the radio frequency signals to be emitted or received by the plurality of patch antennas.

This allows a gap between the two ground terminals to be significantly narrowed more than ½ of the effective wave length. Therefore, the radio frequency signals can be more reliably shielded, and thus a further improvement in RF characteristics can be intended.

Also, the antenna module may have a plurality of ground terminals including the ground terminal, and at least one of the plurality of ground terminals may be arranged, when viewed from the perpendicular direction, between the signal terminal and the radio frequency circuit component.

This allows isolation of the radio frequency circuit component and the signal terminal to be improved. Thus, it is possible to reduce a mutual influence between the radio frequency circuit component and the ground terminals, such as an influence to be given by the signal transmitted via the signal terminal on the radio frequency signal component or an influence to be given by unwanted emission from the radio frequency circuit component on the signal terminal. Thus, a further improvement in RF characteristics can be intended.

Also, the ground terminal may be made of copper or an alloy having copper as a main component.

As described above, with copper having high conductivity included in the ground terminal, a shielding effect by the ground terminal can be improved, and thus a further improvement in RF characteristics can be intended.

Also, the radio frequency circuit component may include a power amplifier which amplifies a signal inputted to the signal terminal, and the plurality of patch antennas may emit signals amplified by the power amplifier.

If the radio frequency signals emitted from the patch antennas propagate to the signal terminal, an unexpected trouble occurs, such as oscillation of the power amplifier, thereby making the RF characteristics deteriorated. By contrast, according to the present aspect, an influence to be given by the above-described radio frequency signals on the signal terminal can be reduced. Therefore, deterioration in RF characteristics caused by inputting, to the power amplifier, the radio frequency signals propagating from the plurality of patch antennas to the signal terminal can be reduced, and an improvement in RF characteristics can be intended.

Also, the radio frequency circuit component may include a phase adjustment circuit which adjusts phases of radio frequency signals transmitted between the plurality of patch antennas and the radio frequency circuit component, and to the signal terminal, a signal with a phase adjusted at the phase adjustment circuit may be inputted or outputted.

If the radio frequency signals by the patch antennas propagate to the signal terminal, an unexpected trouble occurs such that the degree of phase shift cannot be adjusted as desired by the phase adjustment circuit, thereby making the RF characteristics deteriorated. By contrast, according to the present aspect, an influence to be given by the above-described radio frequency signals on the signal terminal can be reduced. Therefore, deterioration in RF characteristics caused by inputting, to the phase adjustment circuit, the radio frequency signals propagating from the plurality of patch antennas to the signal terminal can be reduced, and an improvement in RF characteristics can be intended.

Also, the antenna module may further have a sealing member provided on the second main surface side of the dielectric substrate and made of resin for sealing the radio frequency circuit component, and each of the signal terminal and the ground terminal may be a conductor post penetrating through the sealing member in a thickness direction.

This allows a mount surface side mounted on a motherboard to be planarized for the antenna module having the plurality of patch antennas and the radio frequency circuit component integrated together, and thus simplification of the mounting process is intended.

Also, a communication device according to one aspect of the present disclosure includes any of the above-described antenna modules and a baseband IC (BBIC). The radio frequency circuit component is an RFIC which performs at least one of transmission-system signal processing of up-converting a signal inputted from the BBIC via the signal terminal for outputting to the antenna and reception-system signal processing of down-converting a radio frequency signal inputted from the antenna for outputting via the signal terminal to the BBIC.

According to this communication device, with any of the above-described antenna modules being included, an improvement in RF characteristics is intended.

According to the present disclosure, an improvement in RF characteristics is intended for the antenna module and communication device having the patch antennas and the radio frequency circuit component integrated together.

BRIEF DESCRIPTION OF THE SEVERAL VIEWS OF THE DRAWINGS

FIGS. 3A and 3B depict a plan view and a sectional view of the antenna module according to the embodiment, respectively.

DETAILED DESCRIPTION OF THE DISCLOSURE

Figure 1:
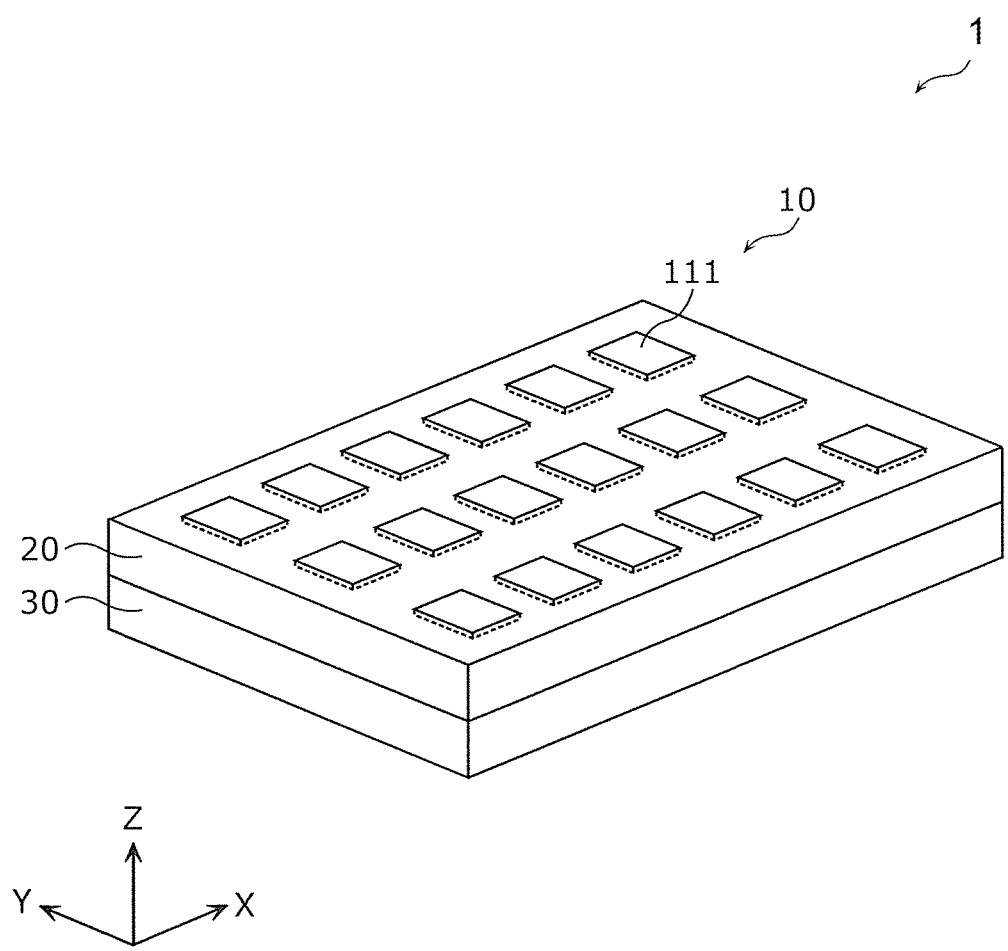
FIG. 1 is an external perspective view of an antenna module according to an embodiment.

In the following, embodiments of the present disclosure are described in detail by using the drawings. Note that any of the embodiments described in the following indicates a comprehensive or specific example. Numerical values, shapes, materials, components, arrangement and topology of the components, and so forth in the following embodiments are merely examples and do not purport limitations of the present disclosure. Among the components in the following embodiments, those not recited in independent claims are described as arbitrary components. Also, the size of a component or a ratio in size in the drawings is not necessarily strict. Also, in each drawing, substantially identical structures are provided with the same reference character and redundant description may be omitted or simplified.

Embodiment

[1. Antenna Module]
[1-1. Structure]

Figure 2:
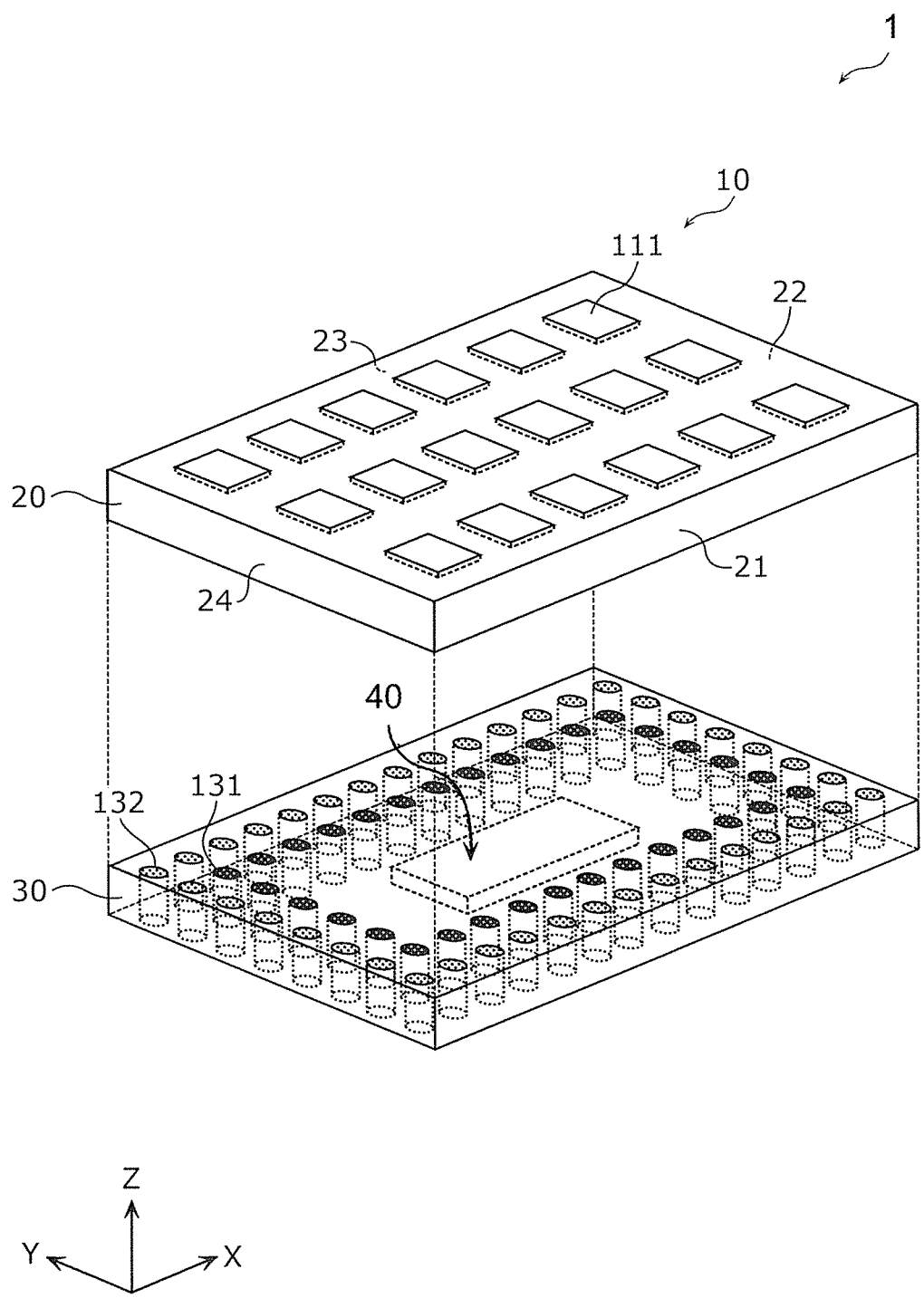
FIG. 2 is an exploded perspective view of the antenna module according to the embodiment.

FIG. 1 to FIGS. 3A and 3B are diagrams depicting the structure of an antenna module 1 according to an embodiment. Specifically, FIG. 1 is an external perspective view of the antenna module 1 according to the embodiment. FIG. 2 is an exploded perspective view of the antenna module 1 according to the embodiment. More specifically, in the drawing, a state is depicted in which a dielectric substrate 20 and a sealing member 30 are separated. FIGS. 3A and 3B depict a plan view and a sectional view of the antenna module 1 according to the embodiment, respectively. More specifically, FIG. 3A depicts a plan view when the antenna module 1 is viewed from an upper surface side (Z-axis plus side in the drawing) by seeing through the dielectric substrate 20, and FIG. 3B depicts a sectional view on a III-III line in FIG. 3A.

In the following, description is made by taking a thickness direction of the antenna module 1 as a Z-axis direction and directions perpendicular to the Z-axis direction and orthogonal to each other as an X-axis direction and a Y-axis direction, with a Z-axis plus side taken as an upper surface (top surface) side of the antenna module 1. However, in an actual use mode, the thickness direction of the antenna module 1 may not be a vertical direction, and thus the upper surface side of the antenna module 1 is not limited to an upper direction. Also, in the present embodiment, the antenna module 1 has a substantially rectangular flat plate shape, and each of the X-axis direction and the Y-axis direction is a direction parallel to two side surfaces of the antenna module 1 adjacent to each other. Note that the shape of the antenna module 1 is not limited to this, may be, for example, a substantially circular flat plate shape and, furthermore, is not limited to a flat plate shape and may be a shape having different thicknesses at a center portion and an outer edge portion.

Also, in FIG. 2, while surface electrodes (also referred to as lands or pads), which are terminals of the RFIC 40, or conductive jointing materials (for example, solder) connected to the surface electrodes are exposed on the upper surface of the sealing member 30, depiction of this is omitted. Also, in FIG. 3B, for the purpose of simplification, components that are present in different cross sections in a strict sense may be depicted in the same drawing, or depiction of components that are present in the same cross section may be omitted.

As depicted in FIG. 1, the antenna module 1 has an array antenna 10 and a dielectric substrate 20 having the array antenna 10 provided on an upper surface side. Furthermore, in the present embodiment, the antenna module 1 has the sealing member 30 provided on a lower surface of the dielectric substrate 20. Also, as depicted in FIG. 2 and FIGS. 3A and 3B, the antenna module 1 has, on a lower surface side of the dielectric substrate 20, an RFIC 40 which is a radio frequency circuit component, a signal conductor post 131 which is a signal terminal, and a ground conductor post 132 which is ground terminals. In the present embodiment, these RFIC 40, signal conductor post 131, and ground conductor post 132 are covered by the sealing member 30, except a lower surface of the signal conductor post 131 and a lower surface of the ground conductor post 132. Also, in the present embodiment, a plurality of signal conductor posts 131 and a plurality of ground conductor posts 132 are provided. Note that each of the number of signal conductor posts 131 and the number of ground conductor posts 132 is not particularly limited and is only required to be one or more.

In the following, each of these members configuring the antenna module 1 is specifically described.

The array antenna 10 is an antenna provided on an upper surface side (Z-axis plus side), which is a first main surface side of the dielectric substrate 20, and including a plurality of patch antennas 111 which emit or receive radio frequency signals. In the present embodiment, the array antenna 10 is formed of eighteen patch antennas 111 two-dimensionally arranged in six rows and three columns.

Note that the number and arrangement of the patch antennas 111 configuring the array antenna 10 are not limited to the above and, for example, the plurality of patch antennas 111 may be arranged as being one-dimensionally aligned.

Each of the patch antennas 111 is configured of, as depicted in FIGS. 3A and 3B, a pattern conductor provided substantially parallel to a main surface of the dielectric substrate 20, and has a feeding point 111p on the lower surface of that pattern conductor. This patch antenna 111 emits a fed radio frequency signal into space or receives a radio frequency signal in space. In the present embodiment, the patch antenna 111 emits a radio frequency signal fed from the RFIC 40 to the feeding point 111p into space, and receives a radio frequency signal in space for outputting from the feeding point 111p to the RFIC 40. That is, the patch antenna 111 in the present embodiment is an emission element which emits an electric wave (spatially-propagating radio frequency signal) corresponding to a radio frequency signal transmitted to and from the RFIC 40 and also a reception element which receives that electric wave.

In the present embodiment, the patch antenna 111 has a rectangular shape surrounded by paired sides extending to the Y-axis direction and opposing in the X-axis direction and paired sides extending to the X-axis direction and opposing in the Y-axis direction when the antenna module 1 is viewed in a planar manner (viewed from the Z-axis plus side), and the feeding point 111p is provided at a position shifted from the center point of that rectangular shape to a Y-axis minus side. Therefore, in the present embodiment, a polarizing direction of electric waves to be emitted or received by the patch antennas 111 is in the Y-axis direction.

The wave length, the band width ratio, and so forth of that electric wave depend on the size (here, the magnitude in the Y-axis direction and the magnitude in the X-axis direction) of the patch antenna 111. Therefore, the size of the patch antenna 111 can be determined as appropriate in accordance with the required specifications such as frequency.

Note that the patch antennas 111 are depicted in FIG. 1 to FIGS. 3A and 3B as being exposed from the upper surface of the dielectric substrate 20. However, it is only required that the patch antennas 111 are provided on an upper surface side of the dielectric substrate 20. For example, when the dielectric substrate 20 is configured of a multilayer board, they may be provided in an inner layer of the multilayer board.

Here, the "upper surface side" means a side upper than the center in the vertical direction. That is, in the dielectric substrate 20 having the first main surface and the second main surface opposite thereto, if a member is "provided on a first main surface side", this means that the member is provided closer to the first main surface than the second main surface. In the following, the same goes for similar representation as to other members.

The dielectric substrate 20 is configured of a substrate element assembly 20a made of a dielectric material and various conductors configuring the above-described patch antennas 111 and so forth. This dielectric substrate 20 in the present embodiment is in a substantially rectangular flat plate shape having four side surfaces 21 to 24 as depicted in FIG. 2 and FIG. 3A, and is a multilayer substrate configured of laminating a plurality of dielectric layers as depicted in FIG. 3B. Note that the dielectric substrate 20 is not limited to this and, for example, may be in a substantially circular flat plate shape or may be a single-layer substrate.

Various conductors of the dielectric substrate 20 include, in addition to pattern conductors configuring the patch antennas 111, conductors forming a circuit configuring the antenna module 1 together with the array antenna 10 and the RFIC 40. The conductors specifically include a pattern conductor 121 and a via conductor 122, which configure a feeder line for transmitting a radio frequency signal between an ANT terminal 141 of the RFIC 40 and the feeding point 111p of the patch antenna 111, and a pattern conductor 124, which transmits a signal between the signal conductor post 131 and an I/O terminal 142 of the RFIC 40.

The pattern conductor 121 is provided in an inner layer of the dielectric substrate 20 along the main surface of the dielectric substrate 20, and connects, for example, the via conductor 122 connected to the feeding point 111p of the patch antenna 111 and the via conductor 122 connected to the ANT terminal 141 of the RFIC 40.

The via conductor 122 is an interlayer connection conductor provided along the thickness direction perpendicular to the main surface of the dielectric substrate 20 for connecting, for example, pattern conductors provided in different layers.

The pattern conductor 124 is provided on the lower surface of the dielectric substrate 20 along the main surface of the dielectric substrate 20 and connects, for example, the signal conductor post 131 and the I/O terminal 142 of the RFIC 40.

As this dielectric substrate 20, for example, a low temperature co-fired ceramic (LTCC) substrate, a printed circuit board, or the like is used.

Note that the dielectric substrate 20 is preferably provided with paired ground pattern conductors arranged to oppose across the pattern conductor 121 on an upper layer and a lower layer of the pattern conductor 121. Furthermore, these ground pattern conductors are preferably provided over the substantially entire dielectric substrate 20. With the ground pattern conductors provided over the substantially entire dielectric substrate 20, it is possible to reduce the propagation of radio frequency signals to be emitted or received by the plurality of patch antennas 111 to each signal conductor post 131 via an inner portion of the dielectric substrate 20. Also, of that paired ground pattern conductors, for example, only the ground pattern conductor on the upper layer of the pattern conductor 121 may be provided, and the ground pattern conductor on the lower layer of the pattern conductor 121 may not be provided.

Also, the pattern conductor 124 may be provided in an inner layer of the dielectric substrate 20 to connect, via a via conductor, the signal conductor post 131 and the I/O terminal 142 of the RFIC 40.

The sealing member 30 is provided on a lower surface (second main surface) side of the dielectric substrate 20, and is made of resin for sealing the RFIC 40. In the present embodiment, the sealing member 30 is provided on the lower surface of the dielectric substrate 20, has four side surfaces flush with the four side surfaces 21 to 24 of the dielectric substrate 20 and one lower surface substantially parallel to the lower surface of the dielectric substrate 20, and is provided on the entire lower surface of the dielectric substrate 20. That is, in the present embodiment, the RFIC 40, the signal conductor posts 131, and the ground conductor posts 132 are buried in the sealing member 30.

Although the material of this sealing member 30 is not particularly limited, for example, epoxy, polyimide resin, or the like is used.

Note that the shape of the sealing member 30 is not limited to the above, and may have a side surface positioned on an inner side or outer side portion of the side surfaces 21 to 24 of the dielectric substrate 20 or may have a step-provided lower surface. Also, the sealing member 30 may not be directly in contact with the lower surface of the dielectric substrate 20, and an insulating film or the like may be provided between the sealing member 30 and the lower surface.

The RFIC 40 is a radio frequency circuit component mounted on a lower surface side of the dielectric substrate 20 and electrically connected to the plurality of patch antennas 111, configuring an RF signal processing circuit. The RFIC 40 performs at least one of transmission-system signal processing of up-converting a signal inputted from a BBIC, which will be described further below, via the signal conductor post 131 for outputting to the array antenna 10 and reception-system signal processing of down-converting a radio frequency signal inputted from the array antenna 10 for outputting to the BBIC via the signal conductor post 131.

In the present embodiment, the RFIC 40 has a plurality of ANT terminals 141 corresponding to the plurality of patch antennas 111 and the plurality of I/O terminals 142 corresponding to the plurality of signal conductor posts 131. For example, as transmission-system signal processing, the RFIC 40 performs up-conversion, splitting, and so forth of a signal inputted to a transmission-system I/O terminal 142 (here, functioning as an input terminal) via a transmission-system signal conductor post 131 to feed the plurality of patch antennas 111 from the plurality of ANT terminals 141. Also, for example, as reception-system signal processing, the RFIC 40 performs combining, down-conversion, and so forth of signals received at the plurality of patch antennas 111 and inputted to the plurality of ANT terminals 141 for output from a reception-system I/O terminal 142 (here, functioning as an output terminal) via a reception-system signal conductor post 131.

Note that one example of signal processing at the RFIC 40 will be described further below together with the structure of a communication device using the antenna module 1.

Also, as depicted in FIGS. 3A and 3B, the RFIC 40 is arranged in an ANT region, which is a region where the plurality of patch antennas 111 are arranged, when viewed from a direction perpendicular to the upper surface of the dielectric substrate 20 (that is, when viewed from the Y-axis plus side). This allows the feeder lines connecting the RFIC 40 and the respective patch antennas 111 to be designed to be short.

Here, the ANT region is a minimum region including the plurality of patch antennas 111 when viewed from the above-described direction, and is a region in a rectangular shape in the present embodiment. Also, when viewed from the above-described direction, the RFIC 40 is positioned in the ANT region, which means that at least part of the RFIC 40 is positioned in the ANT region and, in particular, that the entire RFIC 40 is positioned in the ANT region. By arranging the RFIC 40 in this manner, the feeder lines can be designed as being short for any of the patch antennas 111.

Note that the shape of the ANT region corresponds to the arrangement mode of the plurality of patch antennas 111 and is not limited to a rectangular shape.

The signal conductor post 131 is a signal terminal provided on a lower surface side of the dielectric substrate 20 and electrically connected to the RFIC 40, and is a conductor post penetrating through the sealing member 30 in the thickness direction. In the present embodiment, the signal conductor post 131 is configured to be in a columnar shape and is provided on the lower surface of the dielectric substrate 20. Specifically, the signal conductor post 131 has its upper surface connected to the pattern conductor 124 of the dielectric substrate 20 and its lower surface exposed from the lower surface of the sealing member 30.

The ground conductor post 132 is a ground terminal provided on the lower surface side of the dielectric substrate 20 and set at a ground potential, and is a conductor post penetrating through the sealing member 30 in the thickness direction. In the present embodiment, the ground conductor post 132 is configured to be in a columnar shape and is provided on the lower surface of the dielectric substrate 20. Specifically, the ground conductor post 132 has its upper surface connected to the ground electrode (not depicted) of the dielectric substrate 20 and its lower surface exposed from the lower surface of the sealing member 30.

These signal conductor posts 131 and ground conductor posts 132 serve as external connection terminals of the antenna module 1 when the antenna module 1 is mounted on a motherboard (not depicted). That is, with the signal conductor posts 131 and the ground conductor posts 132 electrically and mechanically connected to electrodes of the motherboard by reflow or the like, the antenna module 1 is mounted on the motherboard.

Although materials of these signal conductor posts 131 and ground conductor posts 132 are not particularly limited, for example, steel with low conductivity (that is, low resistance value) or the like is used.

Note that each of the signal conductor posts 131 and ground conductor posts 132 may not be provided on the lower surface of the dielectric substrate 20. That is, each of the signal conductor posts 131 and ground conductor posts 132 may have its upper end portion buried in the dielectric substrate 20, or may not be directly in contact with the lower surface of the dielectric substrate 20, and an insulating film or the like may be provided between the signal conductor post 131 or the ground conductor post 132 and the lower surface.

Also, the ground conductor post 132 may not be connected to a ground electrode (not depicted) of the dielectric substrate 20, and may be set at a ground potential, with the antenna module 1 mounted on a motherboard (not depicted) to make the ground conductor post 132 connected to the ground electrode of the motherboard. Also, the ground conductor post 132 may be electrically connected to the ground terminal of the RFIC 40 via a pattern conductor of the dielectric substrate 20.

Also, the signal conductor posts 131 and the ground conductor posts 132 are not limited to each have a columnar shape, and each may have, for example, a prismatic shape or a tapered shape having a substantially circular or substantially rectangular cross section.

As has been described above, in the antenna module 1 according to the present embodiment, the plurality of patch antennas 111 are provided on a first main surface side (upper surface side in the present embodiment) of the dielectric substrate 20, and the radio frequency circuit component (RFIC 40 in the present embodiment) is mounted on a second main surface side (lower surface side in the present embodiment) of the dielectric substrate 20. Also, the RFIC 40 is arranged in the ANT region when viewed from a direction perpendicular to the main surface of the dielectric substrate 20 (when viewed from the Z-axis direction in the present embodiment).

With this, according to the present embodiment, feeder lines connecting the radio frequency circuit component and the respective patch antennas 111 can be designed to be short. Thus, with the reduction of the losses produced by the feeder lines, a high-performance antenna module 1 can be achieved. This antenna module 1 is suitable as an antenna module of millimeter wave bands, in which the losses produced by the feeder lines tend to increase as those feeder lines are longer.

[1-2. Positional Relation Between Signal Terminal (Signal Conductor Post) and Ground Terminal (Ground Conductor Post)]

[1-2-1. Details that LED to the Present Disclosure]

Regarding this, as proceeding to develop this antenna module having patch antennas and a radio frequency circuit component integrated together, the inventor of the present application has noticed that the RF characteristics of the antenna module are deteriorated as radio frequency signals (spatially-propagating radio frequency signals, that is, electric waves) to be emitted or received by the patch antennas propagate to the signal terminals (corresponding to the signal conductor posts in the present embodiment).

Specifically, in frequency bands lower than the millimeter wave bands, the size of the signal terminal is sufficiently small compared with the wave length of the radio frequency signal spatially propagating by the patch antennas, and thus the propagation of that radio frequency signal to the signal terminal is difficult. By contrast, in high frequency bands such as the millimeter wave bands, the wave length of the radio frequency signal spatially propagating by the patch antennas is short, and thus the propagation of that radio frequency signal to the signal terminal is easy. Regarding this, to reduce the propagation of that radio frequency signal to the signal terminal, further downsizing of the signal terminal is required, but downsizing of the signal terminal has a limit due to restrictions in the manufacturing process or required specifications. Therefore, in the high frequency bands, it is difficult to sufficiently decrease the size of the signal terminal compared with the wave length of the radio frequency signal spatially propagating by the patch antennas, and the radio frequency signal spatially propagating as described above easily propagates to the signal terminal.

Also, the radio frequency signal spatially propagating by the patch antennas sneaks around a side surface of the dielectric substrate from one main surface side where those patch antennas are provided on that dielectric substrate to the other main surface side. Therefore, the radio frequency signal propagating from the patch antennas to the signal terminal sneaks dominantly from the side surface in the polarizing direction of that radio frequency signal in the dielectric substrate.

Also, this sneaking of the radio frequency signal becomes more significant as a gap from the side surface of the dielectric substrate to the ANT region is narrower, that is, a ratio of occupation of the ANT region is higher when the dielectric substrate is viewed in a planar manner. Therefore, to reduce the sneaking of that radio frequency signal, ensuring a wide gap from the side surface of the dielectric substrate to the ANT region can be thought. However, this structure hinders the downsizing of the antenna module.

Thus, the inventor of the present application has conceived the present disclosure by paying attention to a relative positional relationship between the signal terminals and the ground terminals to reduce the propagation of radio frequency signals (hereinafter may be referred to as "radio frequency signals by the patch antennas") spatially propagating by the patch antennas to the signal terminals, in the antenna module having the patch antennas and the radio frequency circuit component integrated together.

[1-2-2. Positional Relationship in the Present Embodiment]

In the following, a positional relationship between the signal conductor posts 131 (that is, signal terminals) and the ground conductor posts 132 (that is, ground terminals) in the present embodiment is subsequently described by using FIGS. 3A and 3B.

As depicted in FIG. 3A, in the present embodiment, when viewed from a direction perpendicular to the upper surface (that is, the first main surface) of the dielectric substrate 20 (that is, when viewed from the Z-axis plus side), the ground conductor post 132 is arranged between each signal conductor post 131 and a side surface closest to that signal conductor post 131 of the dielectric substrate 20 in a polarizing direction (here, Y-axis direction) of radio frequency signals to be emitted or received by the plurality of patch antennas 111. Specifically, when viewed from the above-described direction, at an end portion of the dielectric substrate 20, the plurality of (here, fourteen) ground conductor posts 132 are arranged along one side surface 21 of the dielectric substrate 20 in that polarizing direction. Also, when viewed from the above-described direction, at an end portion of the dielectric substrate 20, the plurality of (here, fourteen) ground conductor posts 132 are arranged along the other side surface 23 of the dielectric substrate 20 in that polarizing direction.

Also, when viewed from the above-described direction, the plurality of ground conductor posts 132 are arranged as being aligned so as to surround at least one signal conductor post 131, and are arranged as being aligned so as to surround all signal conductor posts 131 in the present embodiment. Specifically, when viewed from the above-described direction, the plurality of ground conductor posts 132 are arranged as being aligned along all of the side surfaces 21 to 24 in an end portion of the dielectric substrate 20. More specifically, the plurality of ground conductor posts 132 are arranged in a rectangular annular shape along the outer periphery of the dielectric substrate 20, and the plurality of signal conductor posts 131 are arranged in a rectangular annular shape on the inner periphery thereof.

Also, the plurality of these ground conductor posts 132 are arranged as being equidistantly aligned, and a distance p between the centers of two ground conductor posts 132 adjacent to each other is ½ or shorter of the effective wave length of radio frequency signals to be emitted or received by the plurality of patch antennas 111. Also, in the present embodiment, the plurality of signal conductor posts 131 are arranged as being equidistantly aligned, and a distance between the centers of two signal conductor posts 131 adjacent to each other is substantially equivalent to the distance between the centers of two ground conductor posts 132 adjacent to each other. Also, in the present embodiment, a distance between the centers of the ground conductor post 132 and the signal conductor post 131 adjacent to each other along each of the side surfaces 21 to 24 of the dielectric substrate 20 is substantially equivalent to the distance between the centers of two ground conductor posts 132 adjacent to each other.

Here, the "effective wave length" means an actual wave length in consideration of the permittivity of a region of interest and, in the present embodiment, means an actual wave length mainly in consideration of permittivity and magnetic permeability of the sealing member 30 provided with the ground conductor posts 132. For example, when a wave length of radio frequency signals to be emitted or received by the plurality of patch antennas 111 in vacuum is taken as $\lambda_0$, relative permittivity of the sealing member 30 is taken as $\varepsilon_r$, and relative magnetic permeability of the sealing member 30 is taken as $\mu_r$, an effective wave length $\lambda_g$ is approximated by the following equation.

$$\lambda_g = \lambda_0 \times 1/\sqrt{(\varepsilon_r \times \mu_r)}$$

Note that the arrangement mode of the plurality of signal conductor posts 131 is not limited to the above and, for example, the plurality of signal conductor posts 131 may be equidistantly arranged with an integral multiple equal to or larger than twice as much as the distance between the centers of two ground conductor posts 132 adjacent to each other and, furthermore, they may not be equidistantly arranged. Also, the distance between the centers of the ground conductor post 132 and the signal conductor post 131 adjacent to each other and aligned along each of the side surfaces 21 to 24 of the dielectric substrate 20 is not limited to the above and, for example, may be an integral multiple equal to or larger than twice as much as the distance between the centers of two ground conductor posts 132 adjacent to each other and may be any distance other than that integral multiple.

According to the present embodiment, by setting the above-described positional relationship between the plurality of signal conductor posts 131 and the plurality of ground conductor posts 132, the spatial propagation of the radio frequency signals from the patch antennas 111 to the signal conductor posts 131 can be reduced. That is, the isolation of the patch antennas 111 and the signal conductor posts 131 can be improved.

[1-2-3. Comparison by Simulations]

This is described by using a first simulation model and a second simulation model.

First, the first simulation model corresponding to a comparative example of the embodiment is described.

Figure 4A:
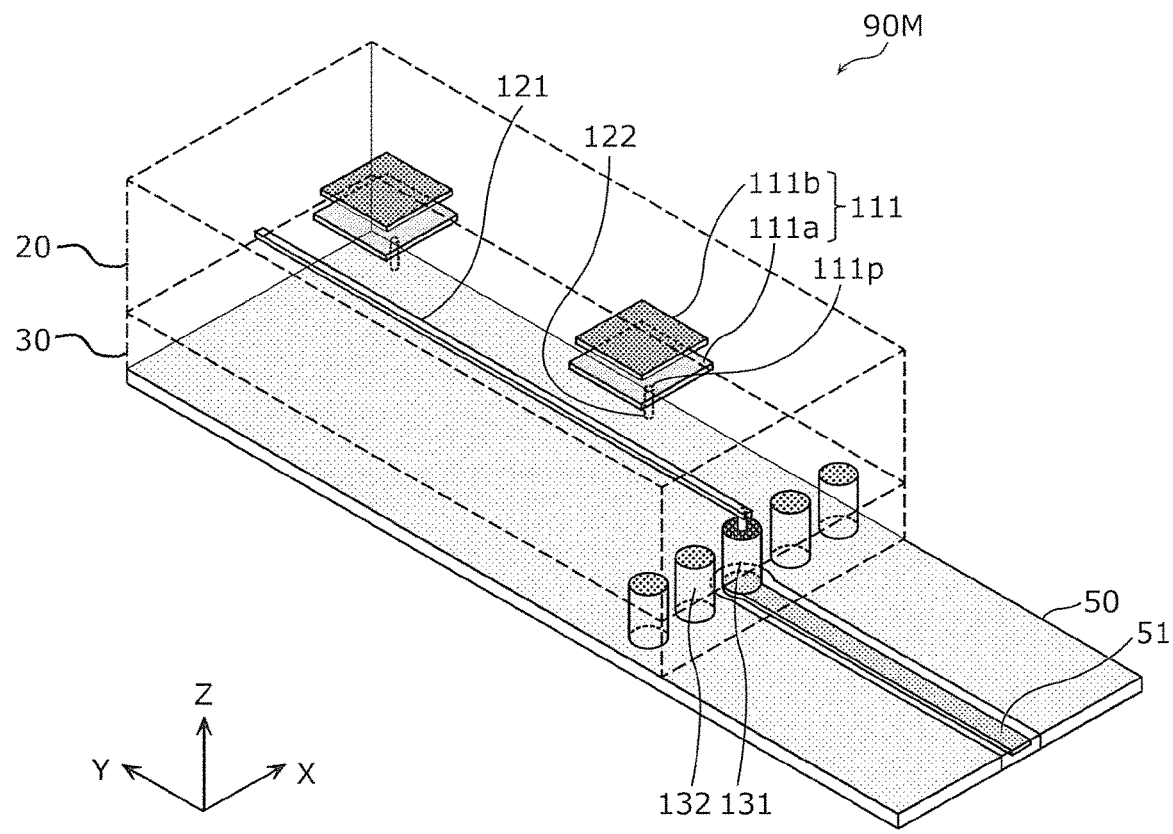
FIG. 4A is a perspective view of a first simulation model.
Figure 4B:
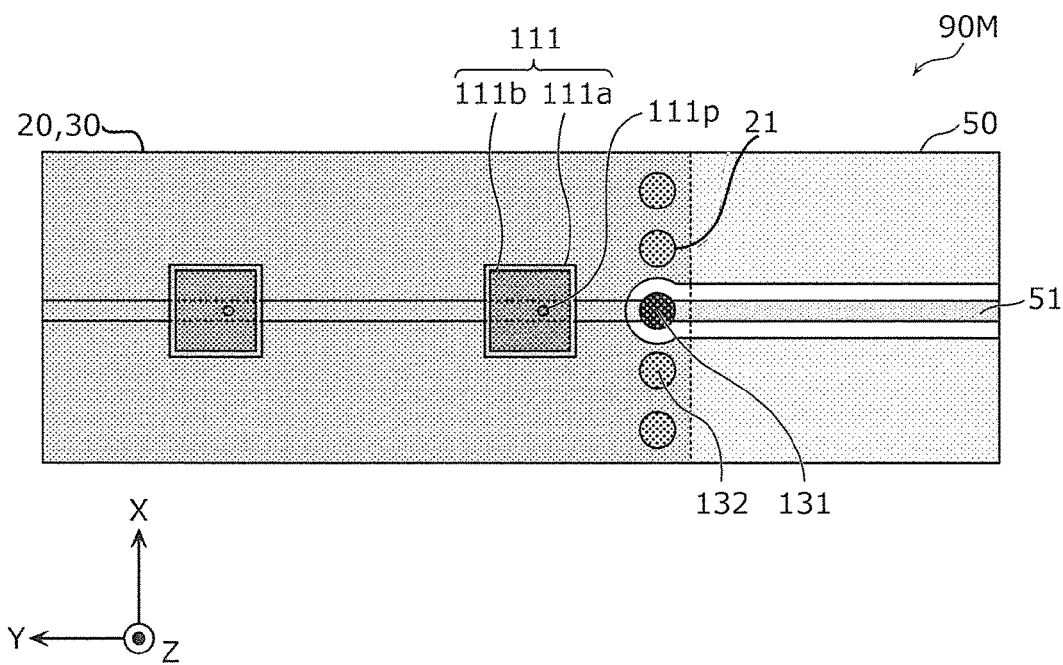
FIG. 4B is a plan view of the first simulation model.

FIG. 4A is a perspective view of a first simulation model 90M. FIG. 4B is a plan view of the first simulation model 90M. In either simulation model, a ground pattern conductor for separating the pattern conductor 121 and a feeding element 111a is provided between the pattern conductor 121 and the feeding element 111a, except that the via conductor 122 configuring a feeder line and its surroundings, but depiction of this is omitted for the purpose of simplification.

Note that while the structure connecting the via conductor 122 connected to the feeding point 111p of the patch antenna 111 and the pattern conductor 121 connected to the signal conductor post 131 is omitted in FIG. 4A, these are electrically connected to each other. Also, in these drawings, a motherboard 50 having the first simulation model 90M mounted thereon and a pattern conductor for feeding 51 in the motherboard 50 are also depicted. As for these matters, the same goes for a perspective view and a plan view of the second simulation model, which will be described further below.

As depicted in these drawings, the first simulation model 90M has a structure supporting two patch antennas 111 adjacent to each other in the Y-axis direction in the antenna module 1 according to the present embodiment. However, compared with the embodiment, the first simulation model 90M is different in that the signal conductor post 131 is arranged at an end portion of the dielectric substrate 20 when viewed from a direction perpendicular to the upper surface of the dielectric substrate 20 (when viewed from the Z-axis plus side). That is, the first simulation model 90M is configured without the ground conductor post 132 arranged between the signal conductor post 131 and the side surface 21 closest to that signal conductor post 131.

Also, in the present embodiment, as the patch antenna 111, one pattern conductor having the feeding point 111*p* has been described as an example. Here, however, in the patch antenna 111, a structure is used, which has the feeding element 111*a*, which is a pattern conductor having the feeding point 111*p*, and a passive element 111*b* without having the feeding point 111*p* and arranged as being separated from the feeding element 111*a* on the upper surface side of the feeding element 111*a*.

Next, the second simulation model corresponding to the embodiment is described.

Figure 5A:
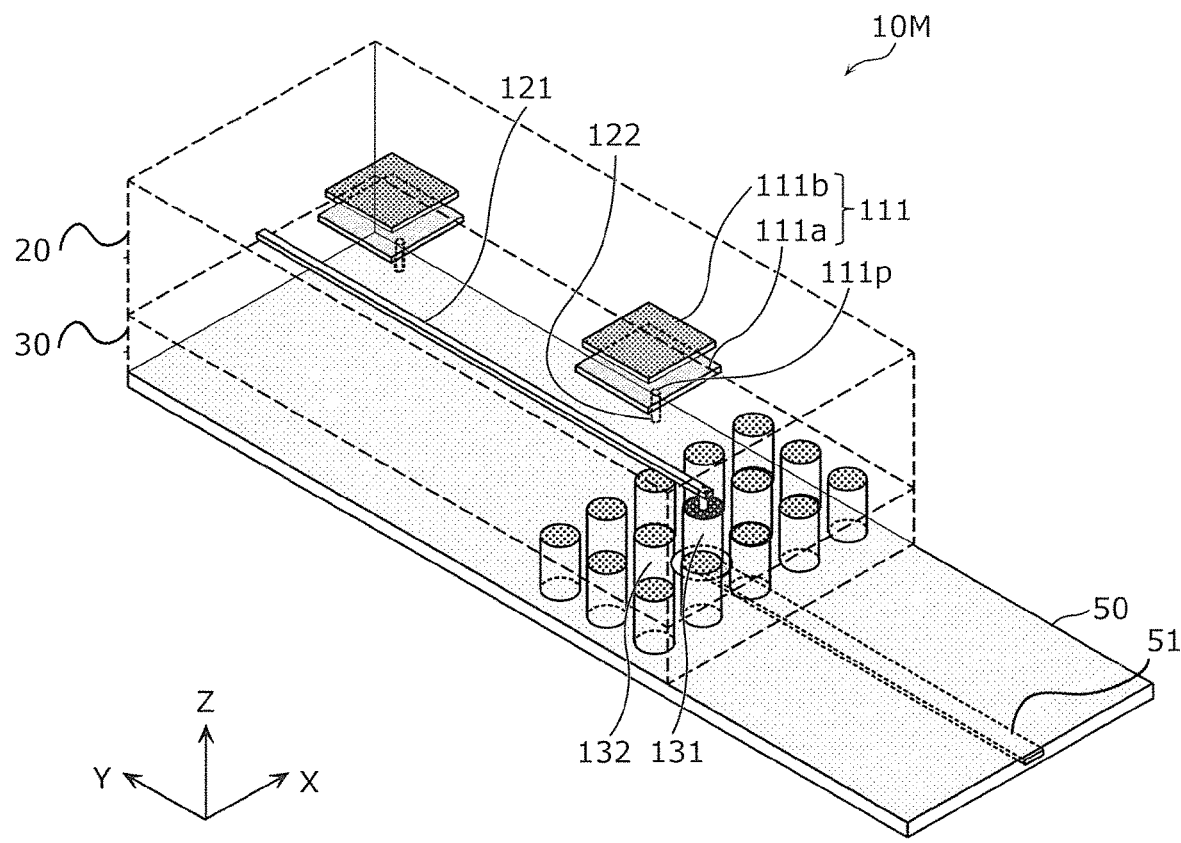
FIG. 5A is a perspective view of a second simulation model.
Figure 5B:
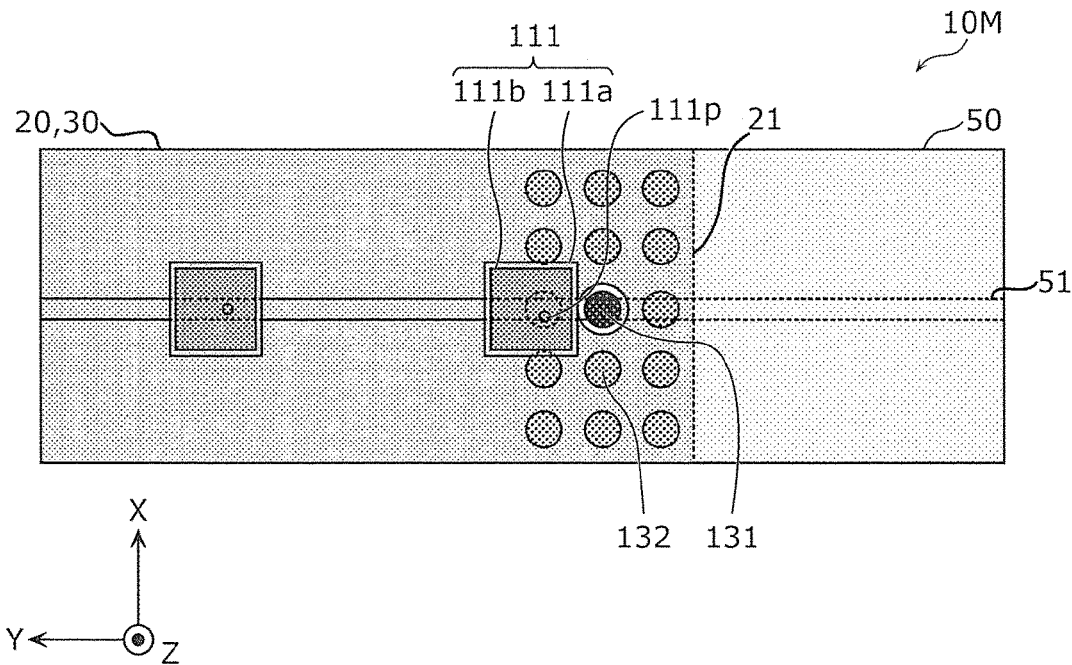
FIG. 5B is a plan view of the second simulation model.

FIG. 5A is a perspective view of a second simulation model 10M. FIG. 5B is a plan view of the second simulation model 10M.

As depicted in these drawings, compared with the first simulation model 90M, the second simulation model 10M has the ground conductor posts 132 arranged between the signal conductor post 131 and the side surface 21 closest to that signal conductor post 131. Also, furthermore, in the second simulation model 10M, the plurality of ground conductor posts 132 are arranged so as to surround the signal conductor post 131. Specifically, compared with the first simulation model 90M, the second simulation model 10M is configured so that the plurality of ground conductor posts 132 are arranged on a side surface 21 side (that is, outer side portion) of the dielectric substrate 20 with respect to the signal conductor post 131 and, furthermore, the plurality of ground conductor posts 132 are arranged on a side opposite to the side surface 21 (that is, inner side portion) of the dielectric substrate 20 with respect to the signal conductor post 131.

Figure 6:
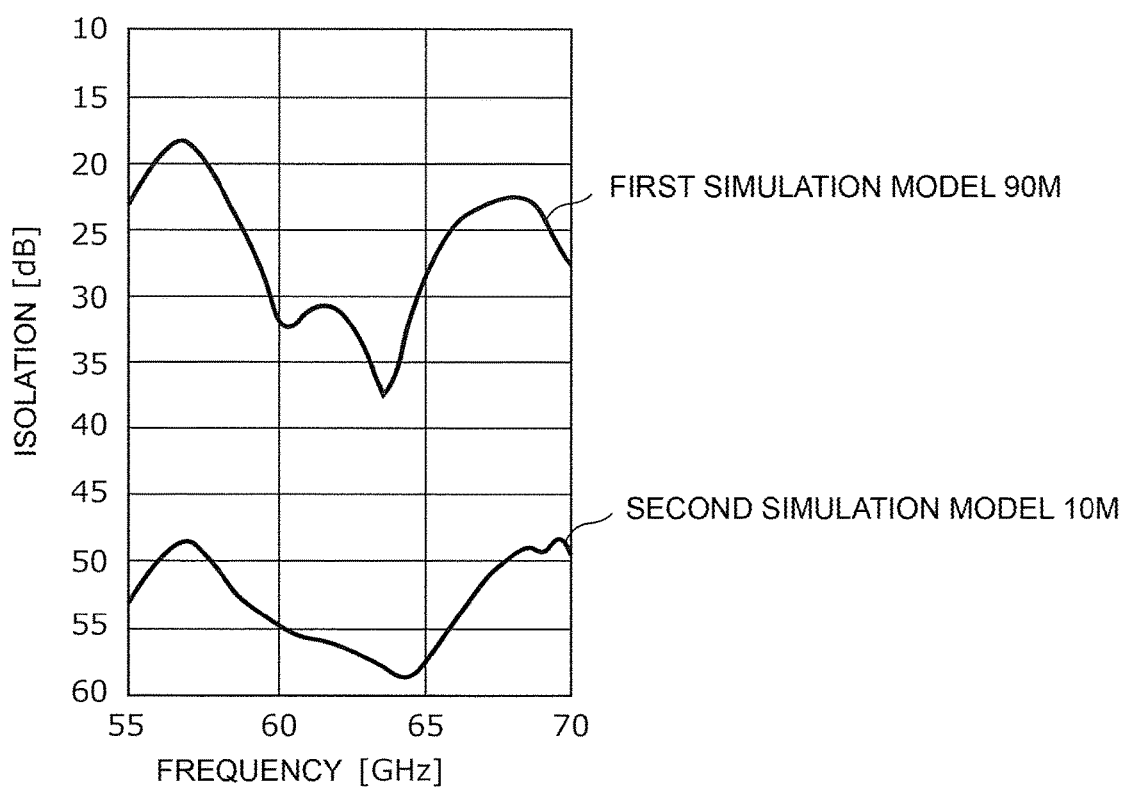
FIG. 6 is a graph depicting isolation characteristics in the first simulation model and the second simulation model.

FIG. 6 is a graph depicting isolation characteristics in the first simulation model 90M and the second simulation model 10M. Specifically, here, as isolation, degrees of separation between the patch antennas 111 and the signal conductor posts 131 are depicted. More specifically, absolute values of intensity ratios of radio frequency signals propagating to the signal conductor posts 131 with respect to the radio frequency signals emitted from the patch antennas 111 are depicted.

As evident from the drawing, according to the second simulation model 10M, compared with the first simulation model 90M, isolation of the patch antennas 111 and the signal conductor posts 131 is improved by 30 dB or more.

[1-2-4. Summary]

As evident from the isolation comparison result of these first simulation model 90M and second simulation model 10M (refer to FIG. 6), according to the present embodiment, the following effects are accomplished. That is, when viewed from a direction perpendicular to the first main surface of the dielectric substrate 20 (when viewed from the Z-axis plus side in the present embodiment), the ground terminal (the plurality of ground conductor posts 132 in the present embodiment) is arranged between the signal terminal (the plurality of signal conductor posts 131 in the present embodiment) and the first side surface (the side surface 21 or side surface 23 in the present embodiment) of the dielectric substrate 20 closest to the signal terminal in the polarizing direction (Y-axis direction in the present embodiment) of the radio frequency signals by the plurality of patch antennas 111. This allows isolation of the plurality patch antennas 111 and the signal terminal to be improved, with the ground terminal serving as a shield. As a result, an influence to be given by the above-described radio frequency signal on the signal terminal can be reduced. Therefore, deterioration in RF characteristics caused by inputting, to the radio frequency circuit component (RFIC 40 in the present embodiment), the radio frequency signals propagating from the plurality of patch antennas 111 to the signal terminal can be reduced. That is, an improvement in RF characteristics can be intended for the antenna module 1 having the patch antennas 111 and the radio frequency circuit component integrated together.

Also, according to the present embodiment, when viewed from the above-described perpendicular direction, with the plurality of ground terminals arranged as being aligned along the first side surface in an end portion of the dielectric substrate 20, isolation of the plurality of patch antennas 111 and the signal terminal can be further improved. Thus, a further improvement in RF characteristics can be intended.

Also, according to the present embodiment, when viewed from the above-described perpendicular direction, with the plurality of ground terminals arranged as being aligned so as to surround the signal terminal, a radio frequency signal polarizing in a polarizing direction different from the above-described polarizing direction can also be shielded for that signal terminal. Thus, isolation of the plurality of patch antennas 111 and the signal terminal can be further improved. Thus, a further improvement in RF characteristics can be intended.

Also, according to the present embodiment, when viewed from the above-described perpendicular direction, with the plurality of ground terminals arranged as being aligned so as to surround all signal terminals, a radio frequency signal polarizing in a polarizing direction different from the above-described polarizing direction can also be shielded for all signal terminals. Thus, isolation of the plurality of patch antennas 111 and all signal terminals can be further improved. Thus, a further improvement in RF characteristics can be intended.

Also, according to the present embodiment, when viewed from the above-described perpendicular direction, with the plurality of ground terminals arranged as being aligned along all of the side surfaces 21 to 24 in the end portion of the dielectric substrate 20, isolation of the plurality of patch antennas 111 and the signal terminal can be improved, and also the signal terminal can be arranged at any position in the region surrounded by the plurality of ground terminals. That is, flexibility in signal terminal layout is improved.

Also, for example, the ground terminal is preferably made of copper or an alloy having copper as a main component. In this manner, with copper having high conductivity included in the ground terminal, a shielding effect by the ground terminal can be improved, and thus a further improvement in RF characteristics can be intended.

Also, according to the present embodiment, the distance between the centers of two ground terminals adjacent to each other among the plurality of ground terminals (distance p between the centers of two ground conductor posts 132 adjacent to each other in the present embodiment (refer to FIG. 3A)) is ½ or shorter of the effective wave length of radio frequency signals to be emitted or received by the plurality of patch antennas 111. This allows a gap between those two ground terminals (gap d between two ground conductor posts 132 adjacent to each other in the present embodiment (refer to FIG. 3A)) to be significantly narrowed to be more than ½ of that effective wave length (for example, 75% or lower). Therefore, that radio frequency signals can be more reliably shielded, and a further improvement in RF characteristics can be intended.

Also, according to the present embodiment, the sealing member 30 which seals the radio frequency circuit component is included, and each of the signal terminal and the ground terminal is a conductor post (specifically, the signal conductor post 131 and the ground conductor post 132, respectively) penetrating through the sealing member 30 in a thickness direction. This allows a mount surface side mounted on a motherboard to be planarized for the antenna module 1 having the plurality of patch antennas 111 and the radio frequency circuit component integrated together, and thus simplification of the mounting process is intended.

[2. Communication Device]

The antenna module 1 according to the present embodiment is mounted, with a lower surface taken as a mount surface, on a motherboard such as a printed circuit board, and can configure, for example, a communication device together with a BBIC 2 mounted on the motherboard.

Regarding this, by controlling the phase and signal intensity of the radio frequency signal emitted from each patch antenna 111, the antenna module 1 according to the present embodiment can achieve sharp directivity. This antenna module 1 can be used for a communication device supporting massive multiple input multiple output (MIMO), which is one of promising wireless transmission techniques in fifth-generation (5G) mobile communication systems.

Thus, in the following, this communication device is described, as the process of the RFIC 40 of the antenna module 1 is also described.

Figure 7:
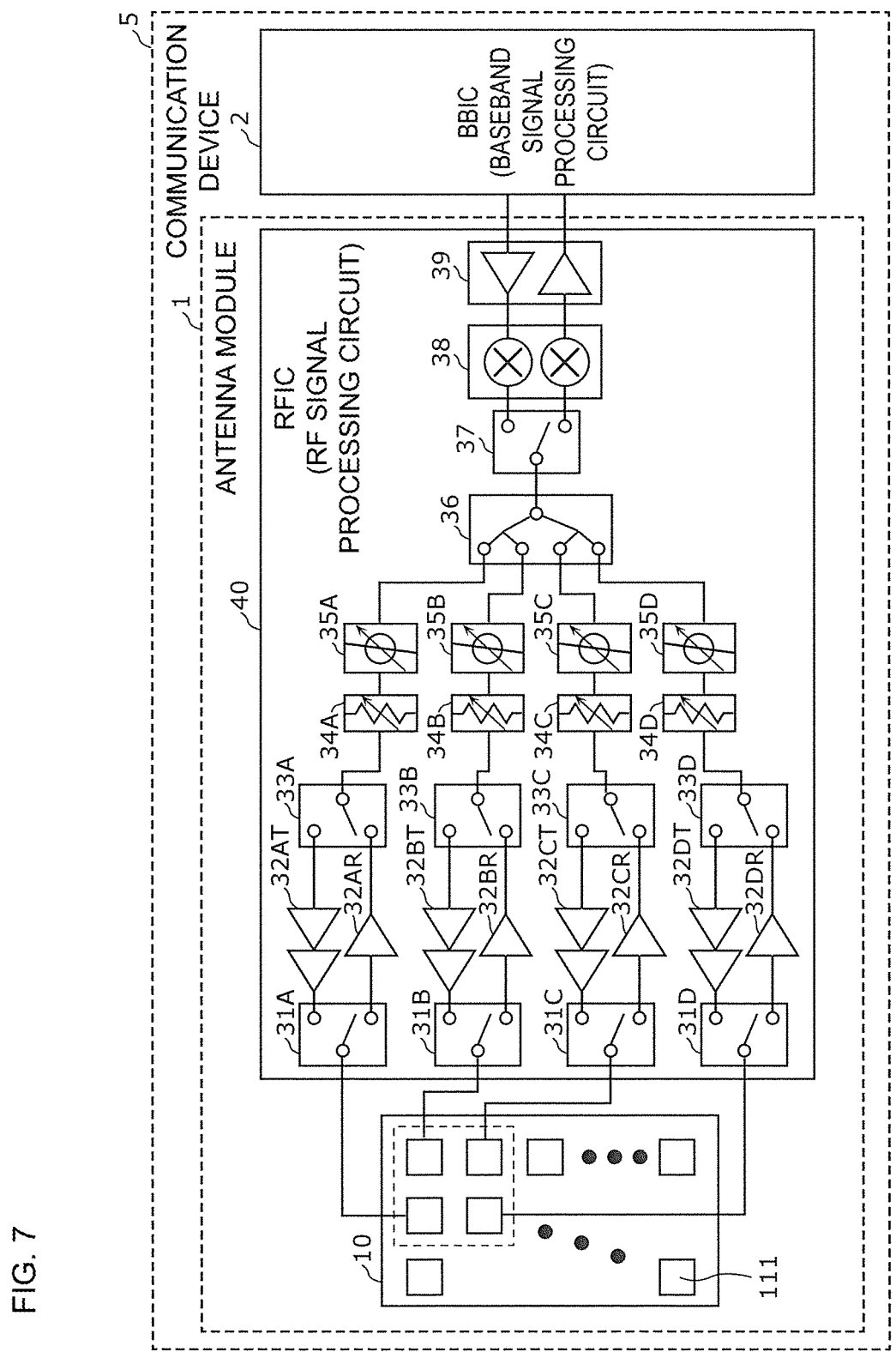
FIG. 7 is a circuitry block diagram depicting the structure of a communication device including the antenna module according to the embodiment.

FIG. 7 is a circuitry block diagram depicting the structure of a communication device 5 including the antenna module 1 according to the embodiment. Note in the drawing that, for the purpose of simplification, only circuitry blocks corresponding to four patch antennas 111 among the plurality of patch antennas 111 included in the array antenna 10 are depicted as circuitry blocks of the RFIC 40 and depiction of the other circuitry blocks is omitted. Also, in the following, the circuitry blocks corresponding to these four patch antennas 111 are described, and description of the other circuitry blocks is omitted.

As depicted in the drawing, the communication device 5 includes the antenna module 1 and the BBIC 2 configuring a baseband signal processing circuit.

The antenna module 1 includes, as described above, the array antenna 10 and the RFIC 40.

The RFIC 40 includes switches 31A to 31D, 33A to 33D, and 37, power amplifiers 32AT to 32DT, low-noise amplifiers 32AR to 32DR, attenuators 34A to 34D, phase shifters 35A to 35D, a signal combiner/splitter 36, a mixer 38, and an amplifier circuit 39.

The switches 31A to 31D and 33A to 33D are switch circuits which each switch between transmission and reception in each signal route.

A signal transmitted from the BBIC 2 via a signal terminal (specifically, transmission-system signal conductor post 131) to the RFIC 40 is amplified at the amplifier circuit 39, and is up-converted at the mixer 38. The up-converted radio frequency signal is split into four waves at the signal combiner/splitter 36, passing through four transmission routes to be fed to different patch antennas 111. Here, with the degree of phase shift of each of the phase shifters 35A to 35D arranged on the respective signal routes individually adjusted, directivity of the array antenna 10 can be adjusted.

Also, radio frequency signals received by the respective patch antennas 111 included in the array antenna 10 are passed via four different reception routes to be combined at the signal combiner/splitter 36, down-converted at the mixer 38, amplified at the amplifier circuit 39, and transmitted via a signal terminal (specifically, reception-system signal conductor post 131) to the BBIC 2.

Note that any of the above-described switches 31A to 31D, 33A to 33D, and 37, power amplifiers 32AT to 32DT, low-noise amplifiers 32AR to 32DR, attenuators 34A to 34D, phase shifters 35A to 35D, signal combiner/splitter 36, mixer 38, and amplifier circuit 39 may not be included in the RFIC 40. Also, the RFIC 40 may have only either of a transmission route and a reception route. Also, the communication device 5 according to the present embodiment not only transmits and receives a radio frequency signal of a single frequency band but can be applied also to a system which transmits and receives radio frequency signals of a plurality of frequency bands (multiband).

In this manner, the RFIC 40 includes the power amplifiers 32AT to 32DT which amplify signals inputted to the signal terminals (signal conductor posts 131 in the present embodiment), and the plurality of patch antennas 111 emit signals amplified at the power amplifiers 32AT to 32DT.

In this communication device 5, if the radio frequency signals emitted from the patch antennas 111 propagate to the signal terminals, an unexpected trouble occurs such as oscillation of the power amplifiers 32AT to 32DT, thereby making the RF characteristics deteriorated.

By contrast, by including the above-described antenna module 1, the communication device 5 can reduce an influence to be given by the above-described radio frequency signal on the signal terminal. Therefore, deterioration in RF characteristics caused by inputting, to the power amplifiers 32AT to 32DT, the radio frequency signals propagating from the plurality of patch antennas 111 to the signal terminals can be reduced, and an improvement in RF characteristics can be intended.

Also, the RFIC 40 includes a phase adjustment circuit which adjusts the phases of radio frequency signals transmitted between the plurality of patch antennas 111 and the RFIC 40. To the signal terminals (signal conductor posts 131 in the present embodiment), signals whose phases are to be adjusted at the phase adjustment circuit are inputted or outputted. Here, in the present embodiment, the phase adjustment circuit is configured of the phase shifters 35A to 35D. To the transmission-system signal conductor posts 131, signals before phase adjustment by the phase adjustment circuit are inputted. To the reception-system signal conductor posts 131, signals after phase adjustment by the phase adjustment circuit are outputted.

In this communication device 5, if the radio frequency signals by the patch antennas 111 propagate to the signal terminals, an unexpected trouble occurs such that the degree of phase shift cannot be adjusted as desired by the phase adjustment circuit, thereby making the RF characteristics deteriorated.

By contrast, by including the above-described antenna module 1, the communication device 5 can reduce an influence to be given by the above-described radio frequency signals on the signal terminals. Therefore, deterioration in RF characteristics caused by inputting, to the phase adjustment circuit, the radio frequency signals propagating from the plurality of patch antennas 111 to the signal terminals can be reduced, and an improvement in RF characteristics can be intended.

Note that the arrangement of the signal terminals (signal conductor posts 131 in the embodiment) and the ground terminals (ground conductor posts 132 in the embodiment) in the antenna module 1 is not limited to the above-described embodiment. Thus, in the following, as modification examples of the embodiment, arrangements different from that of the above-described embodiment are described.

Modification Example 1

Figure 8:
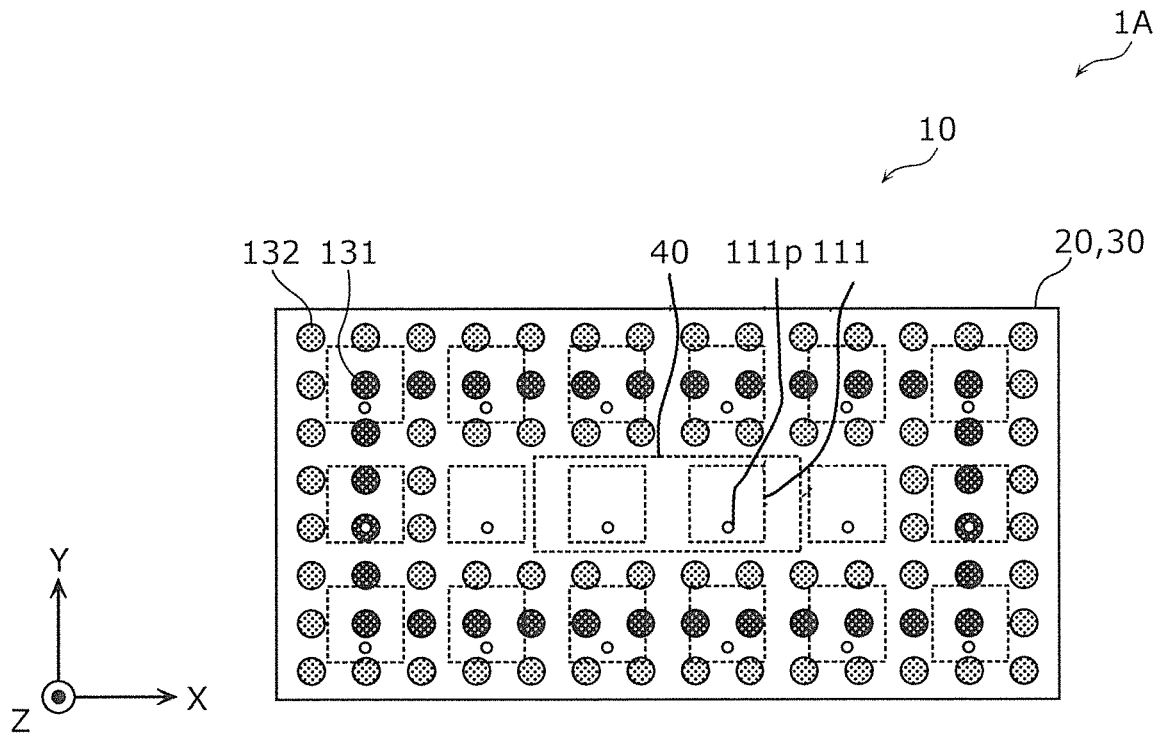
FIG. 8 is a plan view of an antenna module according to a modification example 1 of the embodiment.

FIG. 8 is a plan view of an antenna module 1A according to a modification example 1 of the present embodiment. Note that the drawing depicts a plan view when the antenna module 1A is viewed from an upper surface side (Z-axis plus side in the drawing) by seeing through the dielectric substrate 20. The same goes for a plan view of each of the following modification examples.

As depicted in the drawing, compared with the antenna module 1 according to the embodiment, the antenna module 1A according to the present modification example is different in that, furthermore, when viewed from a direction perpendicular to the first main surface of the dielectric substrate 20 (that is, when viewed from the Z-axis plus side), the ground terminal (here, ground conductor post 132) is arranged between each signal terminal (here, signal conductor post 131) and the radio frequency circuit component (here, RFIC 40). That is, at least one of the plurality of ground terminals included in the antenna module 1A is arranged between the signal terminal and the radio frequency circuit component when viewed from that perpendicular direction.

Specifically, furthermore, in the present modification example, compared with the embodiment, when viewed from that perpendicular direction, the plurality of ground conductor posts 132 arranged in a rectangular annular shape is included between the plurality of signal conductor posts 131 arranged in a rectangular annular shape and the RFIC 40.

Since even the above-configured antenna module 1A according to the present modification example has a structure similar to that of the embodiment, similar effects can be accomplished.

Also, according to the present modification example, furthermore, with the ground terminal (here, ground conductor post 132) arranged between the signal terminal (here, signal conductor post 131) and the radio frequency circuit component (here, RFIC 40), isolation of the radio frequency circuit component and the signal terminal can be improved. Thus, it is possible to reduce mutual influences of the radio frequency circuit component and the ground terminal, such as an influence to be given by a signal transmitted via the signal terminal (that is, a signal flowing through the signal conductor post 131) on the radio frequency circuit component, an influence to be given by unwanted emission from the radio frequency circuit component on the signal terminal, or the like, and thus a further improvement in RF characteristics can be intended.

Modification Example 2

Figure 9:
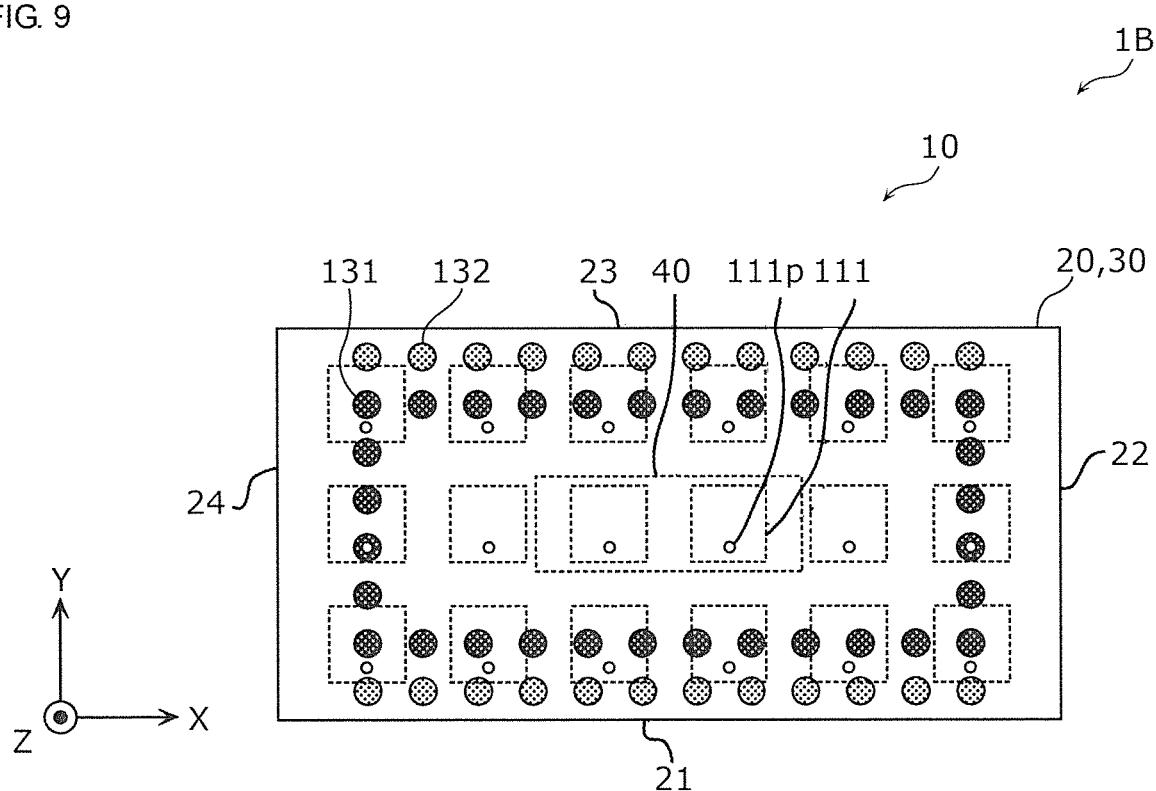
FIG. 9 is a plan view of an antenna module according to a modification example 2 of the embodiment.

FIG. 9 is a plan view of an antenna module 1B according to a modification example 2 of the embodiment.

As depicted in the drawing, compared with the antenna module 1 according to the embodiment, the antenna module 1B according to the present modification example is different in that, when viewed from a direction perpendicular to the first main surface of the dielectric substrate 20 (that is, when viewed from the Z-axis plus side), the plurality of ground terminals (here, ground conductor posts 132) arranged as being aligned along the side surface 22 of the dielectric substrate 20 and the plurality of ground terminals arranged as being aligned along the side surface 24 of the dielectric substrate 20 are not provided. That is, when viewed from that perpendicular direction, for each signal terminal (here, signal conductor post 131), the antenna module 1B only has a ground terminal arranged between the signal terminal and the closest first side surface (side surface 21 or side surface 23 in the present embodiment) of the dielectric substrate 20 in the polarizing direction of the radio frequency signals by the plurality of patch antennas 111.

As with the embodiment, even the above-configured antenna module 1B according to the present modification example can improve isolation of the plurality of patch antennas 111 and the signal terminal, although the effect is somewhat inferior compared with the embodiment 1, with the ground terminal arranged between the signal terminal (here, signal conductor post 131) and the side surface closest to that signal terminal of the dielectric substrate 20.

Modification Example 3

Figure 10:
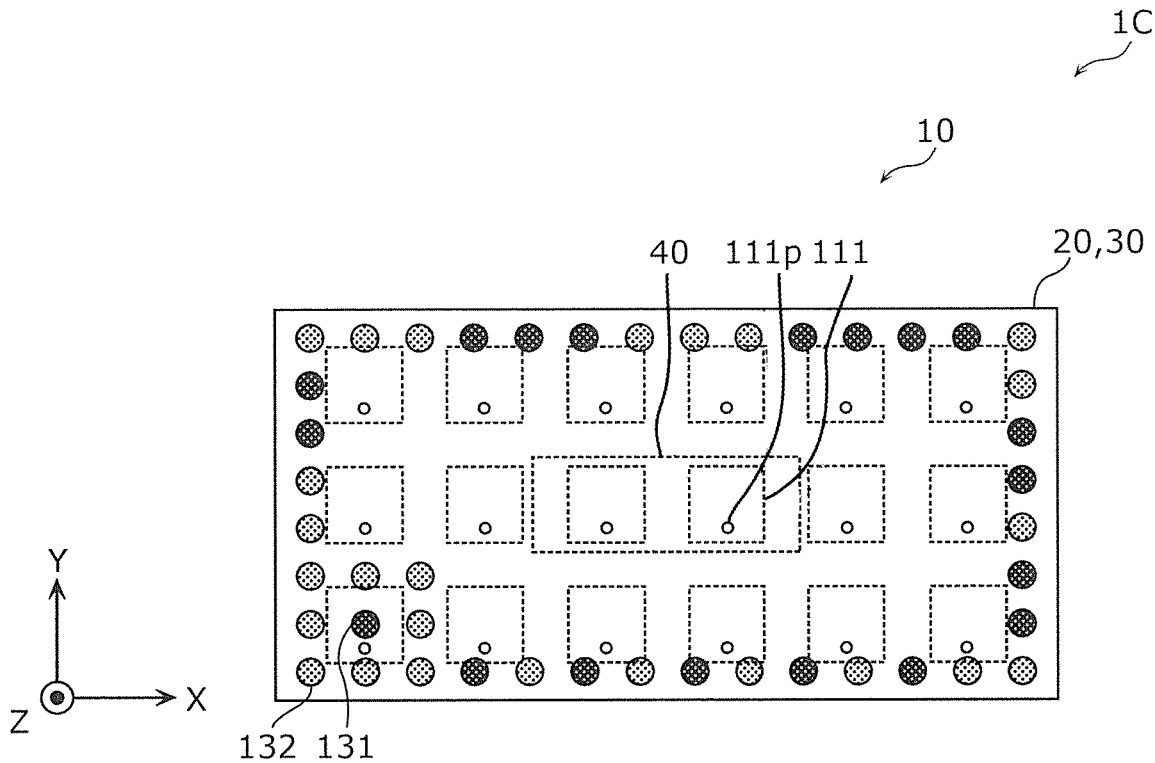
FIG. 10 is a plan view of an antenna module according to a modification example 3 of the embodiment.

FIG. 10 is a plan view of an antenna module 1C according to a modification example 3 of the embodiment.

In the above-described embodiment and its modification examples 1 and 2, all signal terminals (here, signal conductor posts 131) included in the antenna module are shielded by the ground terminals (here, ground conductor posts 132). By contrast, the present modification example is different in that only part of signal terminals among the plurality of signal terminals included in the antenna module 1C are shielded by the ground terminals. Specifically, in the drawing, among the plurality of signal conductor posts 131 and the plurality of ground conductor posts 132, only the signal conductor post 131 positioned second from an X-axis minus side and second from a Y-axis minus side is shielded by eight ground conductor posts 132 surrounding that signal conductor post 131.

For example, the plurality of signal conductor posts 131 electrically connected to the RFIC 40 transmit various signals inputted to the RFIC 40 or various signals outputted from the RFIC 40. Various signals include a signal for radio frequency, a control signal or power supply, and so forth. These various signals are classified into sensitive signals which greatly make the RF characteristics deteriorated when an influence of the radio frequency signals by the plurality of patch antennas 111 is received and non-sensitive signals which do not greatly make the RF characteristics deteriorated when that influence is received.

Thus, in the present modification example, for example, only a signal conductor post 131 which transmits a sensitive signal among the plurality of signal conductor posts 131 may be shielded by the ground conductor post 132.

According to the above-configured antenna module 1C according to the present modification example, by shielding only part of signal terminals among all signal terminals (here, signal conductor posts 131) by the ground terminal (here, ground conductor post 132), the number of ground terminals can be reduced.

Here, the "signal for radio frequency" to be transmitted by the signal conductor post 131 is a signal corresponding to a radio frequency signal to be emitted or received by the plurality of patch antennas 111 and, in the present modification example, is a baseband signal inputted from the BBIC 2 or the like or a baseband signal to be outputted to the BBIC 2.

Regarding this, in the present modification example, as a radio frequency circuit component mounted on the second main surface side of the dielectric substrate 20, the RFIC 40 is described as an example. Thus, the "signal for radio frequency" is a baseband signal with a frequency lower than that of radio frequency signals to be emitted or received by the plurality of patch antennas 111. However, that radio frequency circuit component is not limited to the RFIC 40, and is only required to be a circuit component which processes a signal inputted to a signal terminal for radio frequency (here, signal conductor post 131) for outputting to the array antenna 10 to cause the array antenna 10 to emit a radio frequency signal or which processes a radio frequency signal inputted from the array antenna 10 by being received by the array antenna 10 for outputting to the signal terminal for radio frequency. Therefore, the "signal for radio frequency" is not limited to the baseband signal, and may be a radio frequency signal with a frequency equal to that of radio frequency signals to be emitted or received by the plurality of patch antennas 111.

That is, the "signal for radio frequency" is a signal to be transmitted through a main route of the antenna module 1C, and contains information (for example, digital data of a communication target) included in the radio frequency signal to be emitted or received by the plurality of patch antennas 111. That is, the signal terminal (here, signal conductor post 131) which transmits the signal for radio frequency is an input terminal or output terminal on the main route of the antenna module 1C.

Other Modification Examples

While the antenna module and the communication device according to the embodiment and its modification examples of the present disclosure have been described in the foregoing, the present disclosure is not limited to the above-described embodiment and its modification examples. The present disclosure also includes another embodiment achieved by combining any components in the above-described embodiment, a modification example acquired by making various modifications conceived by a person skilled in the art on the above-described embodiment within a range not deviating from the purport of the present disclosure, and various devices having the antenna module and the communication device of the present disclosure incorporated therein.

For example, furthermore, the antenna module may have a terminal such as a dummy terminal provided on the second main surface side (lower surface side in the above description) of the dielectric substrate 20 and different from the signal terminals (signal conductor posts 131 in the above description) and the ground terminal (ground conductor posts 132 in the above description). As this structure, a structure having a dummy conductor post, which is a dummy terminal, configured of a conductor post is described as an example. For example, the dummy terminal is an independent terminal not electrically connected to others in the antenna modules, and is a terminal for ensuring mechanical connection strength when the antenna module is mounted on a motherboard or the like.

Figure 11:
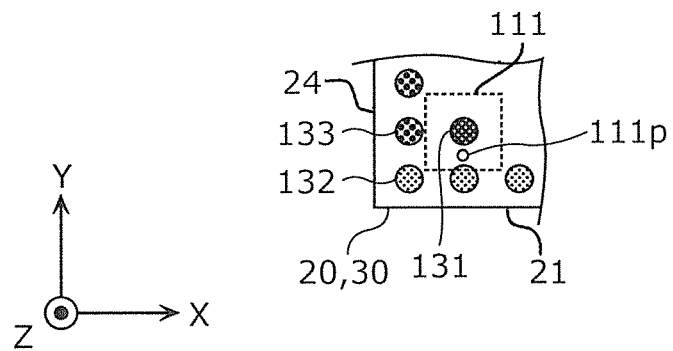
FIG. 11 is a plan view of main units of one example of an antenna module having dummy conductor posts.
Figure 12:
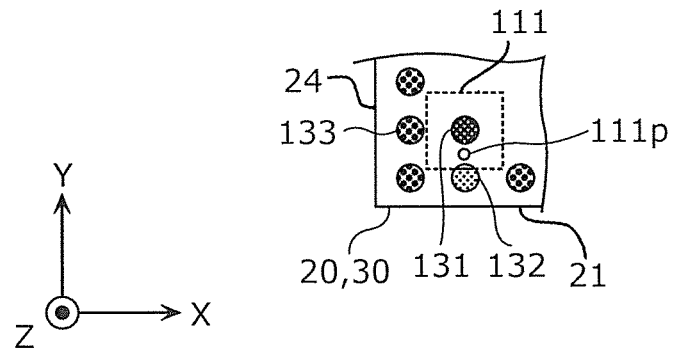
FIG. 12 is a plan view of main units of another example of the antenna module having the dummy conductor posts.

FIG. 11 is a plan view of main units of one example of an antenna module having dummy conductor posts 133. FIG. 12 is a plan view of main units of another example of the antenna module having the dummy conductor posts 133.

As depicted in these drawings, in the antenna module, when viewed from a direction perpendicular to the first main surface of the dielectric substrate 20 (here, when viewed from the Z-axis plus side), it is only required that the ground conductor post 132 is provided between the signal conductor post 131 and the first side surface (here, the side surface 21) closest to that signal conductor post 131 of the dielectric substrate 20 in the polarizing direction (here, Y-axis direction) of the radio frequency signals to be emitted or received by the patch antennas 111. At another terminal layout position, the dummy conductor post 133 may be provided.

Also, the plurality of ground conductor posts 132 may be arranged as being aligned along the first side surface as depicted in FIG. 11, or the ground conductor posts 132 and the dummy conductor posts 133 are arranged as being aligned as depicted in FIG. 12.

Note that the dummy conductor posts 133 depicted in FIG. 11 and FIG. 12 may not be provided. That is, the antenna module may have only one signal conductor post 131 and one ground conductor post 132, and that ground conductor post 132 may be arranged between that one signal conductor post 131 and the first side surface in the polarizing direction of the radio frequency signals by the patch antennas.

Also, in the above description, the structure in which the RFIC 40 performs both of transmission-system signal processing and reception-system signal processing has been described as an example. However, this is not meant to be restrictive, and only either one may be performed.

Also, in the above description, as a radio frequency circuit component, the RFIC 40 has been described as an example. However, the radio frequency circuit component is not limited to this. For example, the radio frequency circuit component may be a power amplifier which amplifies a signal inputted to the signal terminal (signal conductor post 131 in the above description), and the plurality of patch antennas 111 may emit a signal amplified by that power amplifier. Alternatively, for example, the radio frequency circuit component may be a phase adjustment circuit which adjusts the phase of a radio frequency signal transmitted between the plurality of patch antennas 111 and that radio frequency circuit component, and a signal with its phase adjusted at that phase adjustment circuit may be inputted or outputted to the signal terminal (signal conductor post 131 in the above description).

Also, in the above description, the antenna module has the sealing member 30, and the signal terminal and the ground terminal are conductor posts penetrating through the sealing member 30. However, the antenna module may not have a sealing member, and the signal terminal and the ground terminal may be surface electrodes, which are pattern electrodes provided on the second main surface side (for example, on the second main surface) of the dielectric substrate 20. The above-configured antenna module can be mounted by the signal terminal and the ground terminal to a motherboard having a cavity structure or the like.

The present disclosure can be widely used as an antenna element having a band-pass-filter function for communication devices such as millimeter-wave-band mobile communication systems and massive MIMO systems.

1, 1A, 1B, 1C antenna module
2 BBIC
5 communication device
10 array antenna (antenna)
10M second simulation model
20 dielectric substrate
20a substrate element assembly
21 to 24 side surface
30 sealing member
31A, 31B, 31C, 31D, 33A, 33B, 33C, 33D, 37 switch
32AR, 32BR, 32CR, 32DR low-noise amplifier
32AT, 32BT, 32CT, 32DT power amplifier
34A, 34B, 34C, 34D attenuator
35A, 35B, 35C, 35D phase shifter
36 signal combiner/splitter
38 mixer
39 amplifier circuit
40 RFIC
50 motherboard
51, 121, 124 pattern conductor
90M first simulation model
111 patch antenna
111a feeding element
111b passive element
111p feeding point
122 via conductor
131 signal conductor post (signal terminal)
132 ground conductor post (ground terminal)
133 dummy conductor post
141 ANT terminal
142 I/O terminal

The invention claimed is:

1. An antenna module comprising:
a dielectric substrate;
an antenna including a plurality of patch antennas provided on a first main surface side of the dielectric substrate to emit or receive radio frequency signals;
a radio frequency circuit component mounted on a second main surface side opposite to the first main surface of the dielectric substrate and electrically connected to the plurality of patch antennas;
a signal terminal provided on the second main surface side of the dielectric substrate and electrically connected to the radio frequency circuit component; and
a ground terminal provided on the second main surface side of the dielectric substrate and set at a ground potential, wherein
the ground terminal is arranged, when viewed from a direction perpendicular to the first main surface of the dielectric substrate, between the signal terminal and a first side surface of the dielectric substrate closest to the signal terminal in a polarizing direction of the radio frequency signals to be emitted or received by the plurality of patch antennas,
wherein each patch antenna has a feeding point at a position shifted in a first direction from a respective center of each patch antenna, and that emits or receives the radio frequency signal having the polarizing direction in parallel with the first direction.

2. The antenna module according to claim 1, wherein the radio frequency circuit component is arranged, when viewed from the perpendicular direction, in a region where the plurality of patch antennas are arranged.

3. The antenna module according to claim 1, wherein
the antenna module has a plurality of ground terminals including the ground terminal, and
the plurality of ground terminals are arranged as being aligned, when viewed from the perpendicular direction, at positions along the first side surface in an end portion of the dielectric substrate.

4. The antenna module according to claim 1, wherein
the antenna module has a plurality of ground terminals including the ground terminal, and
the plurality of ground terminals are arranged as being aligned, when viewed from the perpendicular direction, so as to surround the signal terminal.

5. The antenna module according to claim 4, wherein
the signal terminal is a terminal to which a signal corresponding to the radio frequency signal is inputted or outputted, and
the plurality of ground terminals are arranged as being aligned, when viewed from the perpendicular direction, so as to surround all signal terminals including the signal terminal.

6. The antenna module according to claim 4, wherein
the plurality of ground terminals are arranged as being aligned, when viewed from the perpendicular direction, at positions along all side surfaces in an end portion of the dielectric substrate.

7. The antenna module according to claim 3, wherein
the plurality of ground terminals are arranged as being equidistantly aligned, and
a distance between centers of two ground terminals adjacent to each other among the plurality of ground terminals is ½ or shorter of an effective wave length of the radio frequency signals to be emitted or received by the plurality of patch antennas.

8. The antenna module according to claim 1, wherein
the antenna module comprises a plurality of ground terminals including the ground terminal, and
at least one of the plurality of ground terminals is arranged, when viewed from the perpendicular direction, between the signal terminal and the radio frequency circuit component.

9. The antenna module according to claim 1, wherein the ground terminal comprises copper or an alloy having copper as a main component.

10. The antenna module according to claim 1, wherein
the radio frequency circuit component includes a power amplifier configured to amplify a signal inputted to the signal terminal, and
the plurality of patch antennas is configured to emit signals amplified by the power amplifier.

11. The antenna module according to claim 1, wherein
the radio frequency circuit component includes a phase adjustment circuit configured to adjust phases of radio frequency signals transmitted between the plurality of patch antennas and the radio frequency circuit component, and
a signal with a phase adjusted at the phase adjustment circuit is inputted to the signal terminal or outputted from the signal terminal.

12. The antenna module according to claim 1, further comprising
a sealing member provided on the second main surface side of the dielectric substrate and comprising a resin for sealing the radio frequency circuit component,
wherein each of the signal terminal and the ground terminal is a conductor post penetrating through the sealing member in a thickness direction.

13. A communication device comprising:
the antenna module according to claim 1; and
a baseband integrated circuit, wherein
the radio frequency circuit component is a radio frequency integrated circuit configured to perform at least one of transmission-system signal processing of up-converting a signal inputted from the base band integrated circuit via the signal terminal for outputting to the antenna and reception-system signal processing of down-converting a radio frequency signal inputted from the antenna for outputting via the signal terminal to the base band integrated circuit.

14. The antenna module according to claim 2, wherein
the antenna module has a plurality of ground terminals including the ground terminal, and
the plurality of ground terminals are arranged as being aligned, when viewed from the perpendicular direction, at positions along the first side surface in an end portion of the dielectric substrate.

15. The antenna module according to claim 2, wherein
the antenna module has a plurality of ground terminals including the ground terminal, and
the plurality of ground terminals are arranged as being aligned, when viewed from the perpendicular direction, so as to surround the signal terminal.

16. The antenna module according to claim 5, wherein the plurality of ground terminals are arranged as being aligned, when viewed from the perpendicular direction, at positions along all side surfaces in an end portion of the dielectric substrate.

17. The antenna module according to claim 4, wherein
the plurality of ground terminals are arranged as being equidistantly aligned, and
a distance between centers of two ground terminals adjacent to each other among the plurality of ground terminals is ½ or shorter of an effective wave length of the radio frequency signals to be emitted or received by the plurality of patch antennas.

18. The antenna module according to claim 5, wherein
the plurality of ground terminals are arranged as being equidistantly aligned, and
a distance between centers of two ground terminals adjacent to each other among the plurality of ground terminals is ½ or shorter of an effective wave length of the radio frequency signals to be emitted or received by the plurality of patch antennas.

19. The antenna module according to claim 6, wherein
the plurality of ground terminals are arranged as being equidistantly aligned, and
a distance between centers of two ground terminals adjacent to each other among the plurality of ground terminals is ½ or shorter of an effective wave length of the radio frequency signals to be emitted or received by the plurality of patch antennas.

20. The antenna module according to claim 2, wherein
the antenna module comprises a plurality of ground terminals including the ground terminal, and
at least one of the plurality of ground terminals is arranged, when viewed from the perpendicular direction, between the signal terminal and the radio frequency circuit component.

* * * * *